(12) United States Patent
Steinhauer

(10) Patent No.: US 6,667,441 B2
(45) Date of Patent: Dec. 23, 2003

(54) DIVERTER DEVICE FOR A FLEXIBLE CIRCUIT

(75) Inventor: Thomas Steinhauer, Gerolzhofen (DE)

(73) Assignee: LEONI-Bordnetz-Systeme GmbH & Co. KG, Nuremberg (DE)

( * ) Notice: Subject to any disclaimer, the term of this patent is extended or adjusted under 35 U.S.C. 154(b) by 41 days.

(21) Appl. No.: 09/953,730

(22) Filed: Sep. 17, 2001

(65) Prior Publication Data

US 2002/0033273 A1 Mar. 21, 2002

(30) Foreign Application Priority Data

Sep. 15, 2000 (DE) .......................................... 100 45 765

(51) Int. Cl.[7] ................................................ H01B 7/08
(52) U.S. Cl. .................................. 174/117 F; 248/74.3
(58) Field of Search ........................ 174/117 F, 117 FF, 174/135; 248/68.1, 71, 74.3

(56) References Cited

U.S. PATENT DOCUMENTS

| | | | | |
|---|---|---|---|---|
| 3,474,188 A | * | 10/1969 | Travis ........................ 174/135 |
| 4,192,965 A | * | 3/1980 | Baum ......................... 174/135 |
| 4,457,482 A | * | 7/1984 | Kitagawa ................... 248/74.3 |
| 4,667,910 A | * | 5/1987 | Atterby et al. ................ 248/71 |
| 5,130,499 A | * | 7/1992 | Dijkshoorn |
| 5,351,017 A | * | 9/1994 | Yano et al. .................... 333/12 |
| 5,937,745 A | * | 8/1999 | Boe ............................... 100/2 |

FOREIGN PATENT DOCUMENTS

| | | |
|---|---|---|
| DE | 199 58 212 A1 | 6/2001 |
| EP | 0 454 272 A1 | 10/1991 |
| GB | 1 225 779 | 3/1971 |

* cited by examiner

Primary Examiner—Chau N. Nguyen
(74) Attorney, Agent, or Firm—Laurence A. Greenberg; Werner H. Stemer; Ralph E. Locher

(57) ABSTRACT

The diverter device can be configured to deflect a flexible conductor, such as a film conductor, in a variety of ways. A base flap, a diverter flap with a diverting edge, and a protective flap are pivotally connected to one another. In the final assembly state, the film conductor is clamped on the one hand between the base flap and the diverter flap, and is clamped on the other hand between the diverting edge and a protective flap. Via the diverting edge, it is thereby diverted for example by 90°. The diverter device enables a diverting of the film conductor without the undesired occurrence of high mechanical loads in the diverting region. The protective flap is thereby used in particular for the mechanical protection of the film conductor.

19 Claims, 5 Drawing Sheets

DIVERTER DEVICE FOR A FLEXIBLE CIRCUIT

BACKGROUND OF THE INVENTION

Field of the Invention

The invention relates to a diverter device for a flexible circuit, in particular for a film conductor.

Flexible circuits and film conductors are distinguished by their flat construction, and thus require only a small structural depth. In the flexible circuit, a plurality of printed conductors are conventionally vapor-deposited on a carrier layer. The special manufacturing method enables complex printed conductor patterns. Such printed conductors are used in particular in the field of motor vehicles, for providing electricity to consumers having moderate power consumption levels, such as for example for supplying control units, loudspeakers, or an interior lighting system.

Due to the flat extension of the flexible circuit, it is essentially suitable only for laying in a straight line. A change of direction of the flexible circuit in the plane of its flat extension is problematic. In particular given a sharp diversion, there is the danger that in the region of the diversion the individual printed conductors will become buckled, or the flexible circuit will be exposed to an excessive mechanical load.

U.S. Pat. No. 5,130,499 (see European published application EP 0 454 272 A1) describes a holding device for a flexible circuit with the aid of which a film conductor pattern, made up of a plurality of film conductor segments, can be held in a folded position. In the holding device, two sub-chambers, separated by a dividing wall, are enclosed between outer to walls. The dividing wall has a first bending edge, around which the film conductor is wrapped. The one outer wall has at its edge an additional, second bending edge situated at a right angle to the first bending edge, around which second edge the film conductor is bent a second time. The holding device as a whole is fashioned in the manner of a housing into which the film conductor must be inserted. For this, it is necessary to fold the film conductor at the desired points already before pushing it into the holding device. This is costly, and also there is the danger that the folding points will not be made at precisely the desired point, or that they will not lie exactly on the bending edges; this can result in exposure of the film conductor to higher loads than are necessary.

SUMMARY OF THE INVENTION

It is accordingly an object of the invention to provide a diverting apparatus for a flat flexible circuit, which overcomes the above-mentioned disadvantages of the heretofore known devices and methods of this general type and which enables simple and reliable laying of a ribbon cable, in particular of a film conductor.

With the foregoing and other objects in view there is provided, in accordance with the invention, a diverter device for a flexible circuit, comprising:

a base flap;

a diverter flap formed with a diverting edge connected to the base flap; and a protective flap connected to the base flap;

wherein the base flap, the diverter flap, and the protective flap are pivotally connected such that, in a final assembly state, when the flexible circuit is in place, a guide region is formed between the base flap and the diverter flap about which the flexible circuit is guided, and which extends up to a diverting region for diverting the flexible circuit formed between the diverting edge and the protective flap.

In other words, the objects of the invention are achieved with a diverter device for a flexible circuit, in particular for a film conductor, also referred to as a holding clip. The clip has a base flap, a diverter flap having a diverting edge, and a protective flap. The flaps are thereby connected with one another in pivotable fashion, such that, with the flexible circuit laid between the base flap and the diverter flap, a guide region is formed in which the flexible circuit is guided, and that extends up to a diverter region that is formed between the diverting edge and the protective flap, in which region the flexible circuit is diverted.

In order to divert the film conductor, the conductor is preferably first laid on the base flap and is held in the guide region by connecting the base flap with the diverter flap. Subsequently, the film conductor is bent around the diverting edge situated on the diverter flap, and is held in this diverted position between the diverting edge and the protective flap.

The diverter device therefore enables a protective deflection of the film conductor in the plane of its flat extension. For this purpose, the film conductor is on the one hand guided through the diverter device in a defined manner. Through the defined bending of the film conductor in the bending or diverting region, an excessive mechanical loading is avoided.

Preferably, the film conductor is hereby clamped in at the guide region and in the diverter region between the respective flaps. For protective diverting, on the other hand, in the diverter region the film conductor is protected from mechanical damage from outside by the protective flap. In particular, the protective flap acts as protection against friction.

The diverter device is preferably made up of a single constructive unit fashioned as an injection-molded part, in which the individual flaps are for example connected with one another via film hinges. The construction as a unified component having a plurality of flaps connected with one another by hinges facilitates the placement of the film conductor into the diverter device, because it is not necessary that a plurality of separate components be connected with one another, or because a complicated threading in of the film conductor is not necessary.

In order to keep the loading of the film conductor low in the region of the diverting edge, this edge preferably has a rounded cross-section. A sharp buckling of the film conductor is thereby prevented.

Preferably, the diverter flap and the base flap each have a planar extension having two base sides and frontal sides situated opposite one another, whereby the base flap and the diverter flap are connected with one another at one of their base sides. In this construction, a lateral folding up of the base flap and of the diverter flap is therefore enabled. The film conductor is thereby preferably guided parallel to the base sides through the diverter device.

Usefully, for transverse folding of the film conductor the diverting edge is provided at one of the frontal sides of the diverter flap. At the same time, an angle of diversion for the flexible circuit is defined by the angle enclosed between one of the base sides and thus diverting edge. In this context, 'transverse folding' or 'transverse diverting' refer to the diverting of the film conductor at an angle to its longitudinal direction. The film conductor is accordingly placed around the diverting edge at a frontal side of the diverter device, in the final assembled state. Because the angle of diversion is defined by the angular relation between the base side and the frontal side, different diverter devices can be manufactured, having almost any desired diverter angles. In particular, a 90° diversion, or even a 180° diversion, of the film conductor is enabled by a suitable construction of the diverter device. For a construction that is as simple and symmetrical as possible, the base flap and the diverter flap are fashioned with identically corresponding base surfaces, so that in the final assembled state these two flaps are situated one over the other so as to fit precisely. The base surface thereby essentially defines the guide region. This surface is preferably fashioned as a parallelogram.

Preferably, the protective flap is situated on the frontal side, allocated to the diverter flap, of the base plate. For the clamping of the film conductor in the diverter region, the protective flap is simply pivoted closed, from the base plate in the direction onto the diverter flap.

According to a preferred construction, as an alternative the diverting edge is situated on the base side, facing away from the base flap, of the diverter flap. In this way, a longitudinal folding of the flexible circuit is possible, i.e., a folding in its longitudinal direction. In principle, this longitudinal folding takes place in a manner similar to the transverse folding. Only the diverter flap, and also usefully the appertaining protective flap, are situated on the base sides, running parallel to the longitudinal direction of the film conductor, of the diverter flap or of the base flap. The diverter flap and the base flap are thereby in addition connected with one another pivotably at one of their base sides, in order to enable the film conductor to be guided in or out at the frontal sides.

The longitudinal folding of the film conductor is of great advantage if a multi-row terminal plug is used. Such a multi-row terminal plug is distinguished by at least two planes situated one over the other, in which connection possibilities are provided. In this way, there is the possibility of guiding the one half of the printed conductors of the film conductor for example into the upper connection plane, and the second half into the lower connection plane. The multi-row terminal plug is thereby of narrow construction. The film conductor is supplied to the terminal plug in quasi-double-layer fashion, in two subpaths. The diverter device is thus hereby used for the division of the film conductor from one conductor plane into two conductor planes.

Preferably, in the final assembled position an additional guide region for the film conductor is thereby formed between the protective flap and the diverter flap. Thus, the film conductor is guided through the diverter device in two layers, whereby the individual flaps are situated one over the other in the manner of layers, and a subpath of the film conductor is respectively routed between two adjacent flaps. The individual flaps thereby usefully have the same base surface.

According to another advantageous construction, the diverter device is fashioned both for longitudinal folding and for transverse folding. For this purpose, the diverter device has, in addition to the diverter edge for the longitudinal folding, an additional diverting edge for the transverse folding. This additional edge is thereby preferably connected with one of the frontal sides of the protective flap.

For the protection of the additional transverse folding of the film conductor, another protective flap is provided that works together with the additional diverting edge. In particular, the protective flap is connected with one of the frontal sides of the base flap. In this combined construction for longitudinal folding and transverse folding, the constructive features for the design for longitudinal folding and the design for transverse folding are accordingly combined with one another.

In order to enable a simple and reliable placement of the film conductor into the diverter device, in the guide region a fixing element is provided for fixing the film conductor. A slipping of the film conductor in the diverter device, in particular during the placement of the film conductor, is avoided in this way.

Also in order to facilitate assembly, a holding element for the bent part of the film conductor is preferably provided on an assembly upper side that faces away from the guide region. This holding element serves to hold the film conductor already in the diverted position before it is clamped between the diverting edge and the protective flap.

Usefully, in the final assembled state at least some of the flaps are fixedly connected with one another; in particular, they are fixedly latched to one another. In this way, a secure, defined diverting of the film conductor is achieved.

For a simple assembly of the diverter device, on an assembly lower side a fastening element is provided for fastening, for example, to a body component of a motor vehicle. In addition to the fastening element, an additional element can be provided for protection against twisting.

In a preferred construction, the diverter device has on its assembly upper side a coupling element for situating an additional diverter device. This coupling element is thereby for example fashioned so as to be complementary to the fastening element on the assembly lower side, so that two diverter devices can be connected with one another in the manner of a stack, via the coupling element and the fastening element.

Other features which are considered as characteristic for the invention are set forth in the appended claims.

Although the invention is illustrated and described herein as embodied in a diverter device for a flexible circuit, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

BRIEF DESCRIPTION OF THE DRAWINGS

Identical and functionally equivalent elements are identified with the same reference characters throughout the individual figures.

DESCRIPTION OF THE PREFERRED EMBODIMENTS

Figure 1:
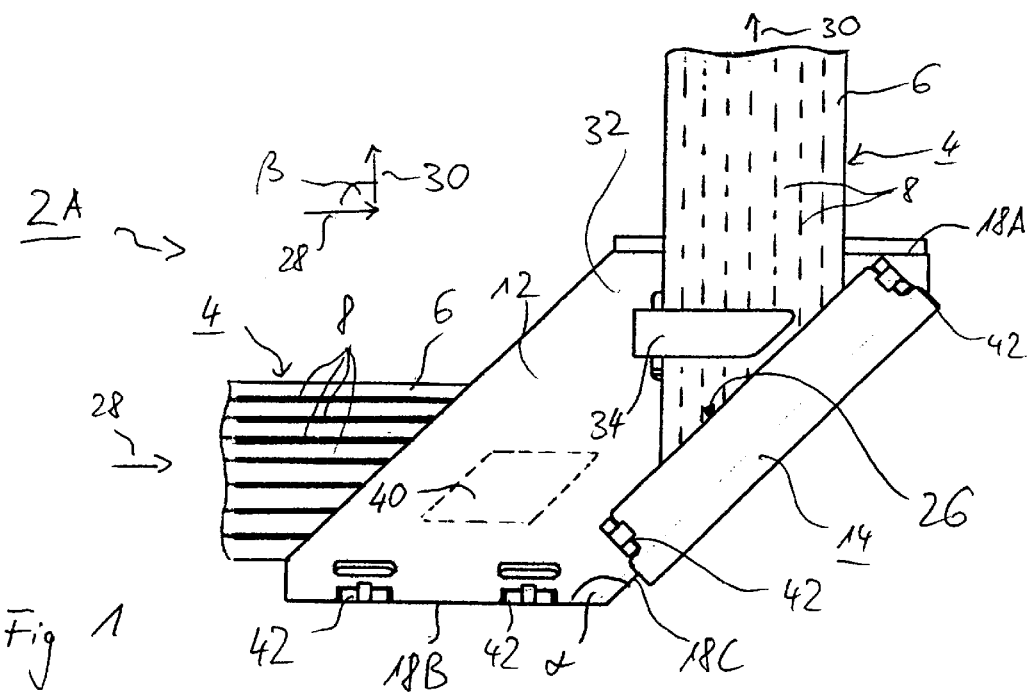
FIG. 1 shows a top view of a diverter device in the final assembled state for the transverse folding of a film conductor for a 90° diversion, with installed film conductor.
Figure 2:
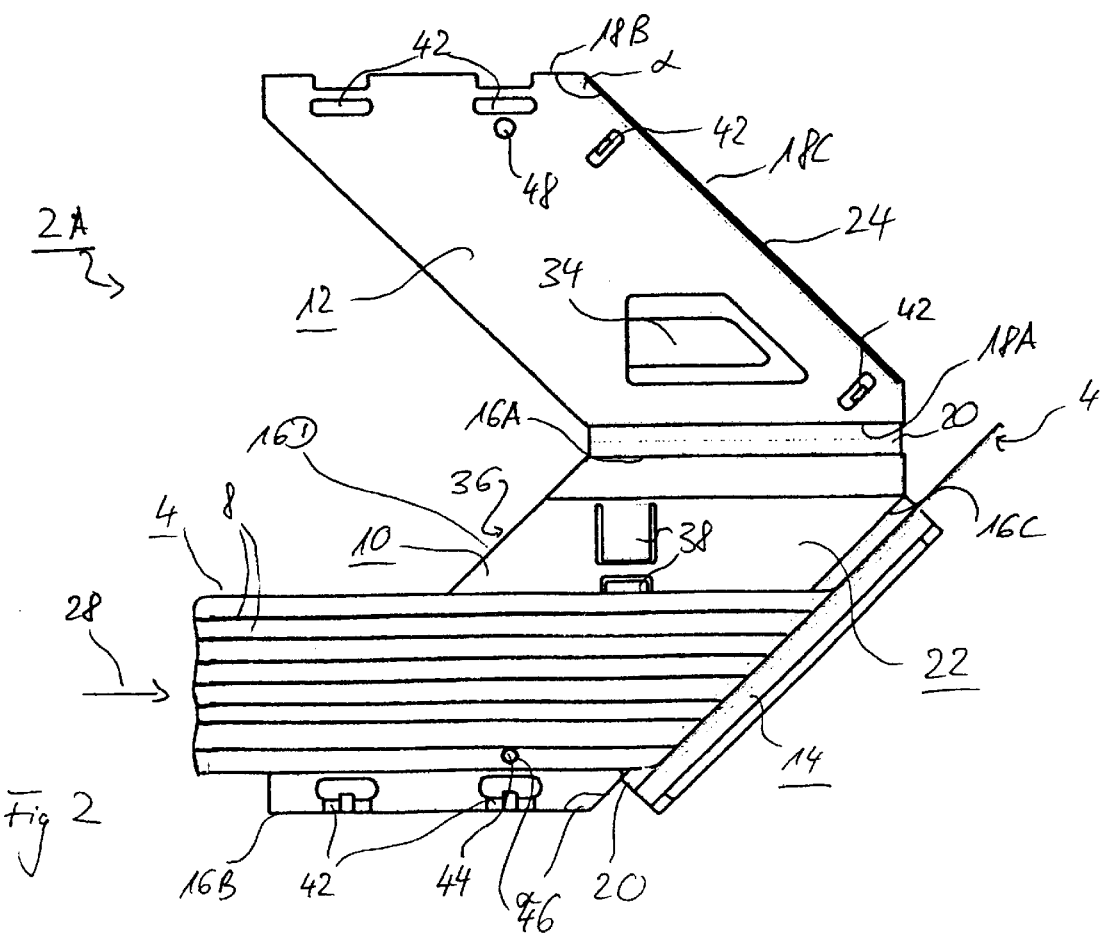
FIG. 2 shows the diverter device according to FIG. 1, in an intermediate assembly position.

Referring now to the figures of the drawing in detail and first, particularly, to FIGS. 1 and 2 thereof, a first construction of a diverter device 2A for a film conductor 4 is used for transverse folding or transverse diversion of a film conductor 4 by 90°. The film conductor 4 comprises a plurality of printed conductors 8 applied on the upper side of a carrier layer 6. These are represented as solid lines, insofar as the view is directed onto the upper side of the carrier layer. They are represented as broken lines insofar as the view is directed from the lower side to carrier layer 6.

The diverter device 2A has a base flap 10, a diverter flap 12, and a protective flap 14. The base flap 10 and diverter flap 12 each have base surfaces constructed as parallelogram, bounded by base sides 16A,B or 18A,B, which respectively run parallel to one another. Base sides 16A,B; 18A,B are respectively connected with frontal sides 16C,D; 18C,D, which likewise run parallel to one another.

The diverter flap 12 and the base flap 10 are connected with one another at their base sides 16A, 18A via a film hinge 20, so as to be capable of pivoting motion. The protective flap 14 is arranged on frontal side 16C of base flap 10 so as to be capable of pivoting, likewise via a film hinge 20.

Between the base flap 10 and the diverter flap 12, the film conductor 4 is clamped in a guide region 22. The diverter flap 12 comprises a diverting edge 24 on its one frontal side 18C. In the final assembled state, the film conductor 4 is diverted around the diverting edge 24. A diverter region 26 is thereby defined between the diverting edge 24 and the protective flap 14 in which the film conductor 4 is likewise clamped in the final assembled state.

Base side 16B and frontal side 16C of base flap 10, as well as the corresponding base side 18B and the corresponding frontal side 18C of diverter flap 12, respectively enclose an angle α. Because diverting edge 24 runs parallel to frontal side 18C, and film conductor 4 is laid with its entry longitudinal direction 28 parallel to base side 18B, an angle of diversion β for the film conductor 4 is defined via angle α. This angle of diversion β designates the angle between entry longitudinal direction 28 and an exit longitudinal direction 30 of the film conductor. In the variant embodiment according to FIGS. 1 and 2, angle α is 135°, so that a diversion angle β of 90° is formed. Dependent on the construction of angle α, arbitrary diversion angles β can be realized.

The diverter device 2A has a mounting element or holding element 34 on its assembly upper side 32, i.e., on the outer side, facing away from guide region 22, of the diverter flap 12. Holding element 34 is thereby fashioned in the form of a clip, under which film conductor 4 is guided through.

Figure 5:
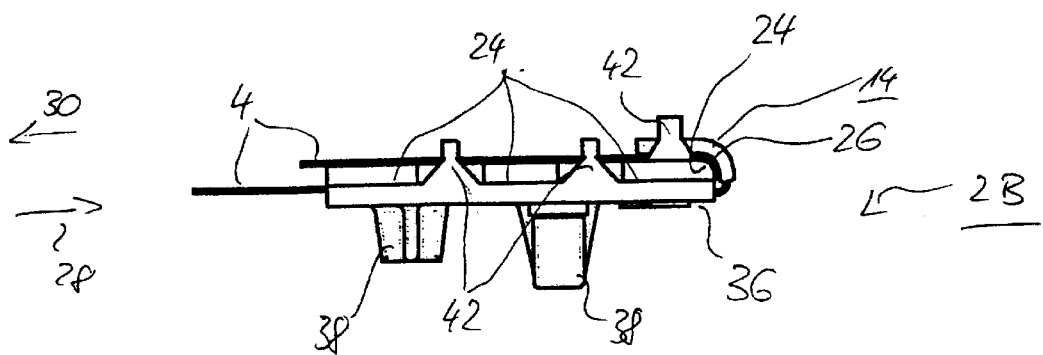
FIG. 5 is a side view of the diverter device according to FIG. 3 in the final assembled state.

On an assembly lower side 36, defined by the outer side, facing away from guide region 22, of the base flap 10, there are arranged fastening elements 38 (cf. also in particular FIG. 5). These fastening elements 38 are used to fasten diverter device 2A to, for example, a body part of a motor vehicle. In addition, a coupling element 40, preferably fashioned so as to be complementary to fastening element 38, can be provided on assembly upper side 22. Via the coupling element and fastening element 38, two diverter devices 2A can be connected with one another in the manner of a stack. In FIG. 1, coupling element 40 is indicated only schematically, by a broken line.

Individual flaps 10, 12, 14 additionally comprise a plurality of latch elements 42 that are used to ensure that in the final assembled state the individual flaps 10, 12, 14 are fixedly connected with one another via latch connections.

In addition, fixing elements are situated in guide region 22 for fixing the film conductor 4 during installation into diverter device 2A. The fixing elements are thereby formed by a fixing pin 44 attached to the base flap 10. The pin engages through a corresponding fixing opening 46 in the film conductor 4 and is supported in a fixing hole 48 on the diverter flap 12.

The following procedure is carried out for diverting the film conductor 4 by means of diverter device 2A: in the folded-open state of the diverter device 2A, which can be seen in FIG. 2, the film conductor 4 is placed on the base flap 10 and is held via the two fixing elements 44, 46 so that it cannot slip. The longitudinal direction 28 of entry is thereby oriented parallel to base side 16B. Subsequently, the diverter flap 12 is latched together with base the flap 10 via the latch elements 42, and the film conductor 4 is clamped in the guide region 22. The film conductor 4 is thereupon bent along the diverting edge 24, and is fastened under the holding element 34, so that in the diverted position it is provisionally held via the holding element 34. The holding element 34 therefore facilitates the placement of the film conductor 4. In the last step, the protective flap 14 is latched to the diverter flap 12 via the corresponding latch elements 42, so that the film conductor 4 is clamped between the diverter flap 24 and the protective flap 14 in the diverting region 26.

The diverting region 26 of the film conductor 4 is securely protected against external influences by the protective flap 14. At the same time, the mechanical load of the film conductor 4 is kept low by the defined guiding of the film conductor 4 in the diverter device 2A. For this purpose, in particular the diverting edge 24 is constructed in rounded fashion. The diverter device 2A thus ensures that the film conductor 4 is not buckled with a sharp edge.

Figure 3:
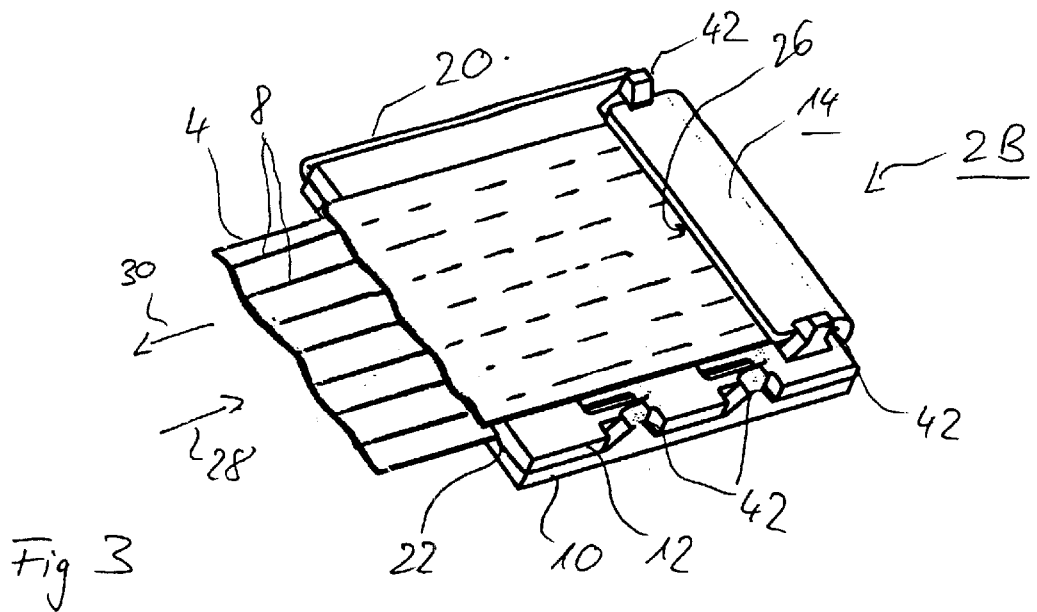
FIG. 3 shows a perspective view of a diverter device in the final assembled state, for the transverse folding of a film conductor for a 180° diversion, with installed film conductor.
Figure 4:
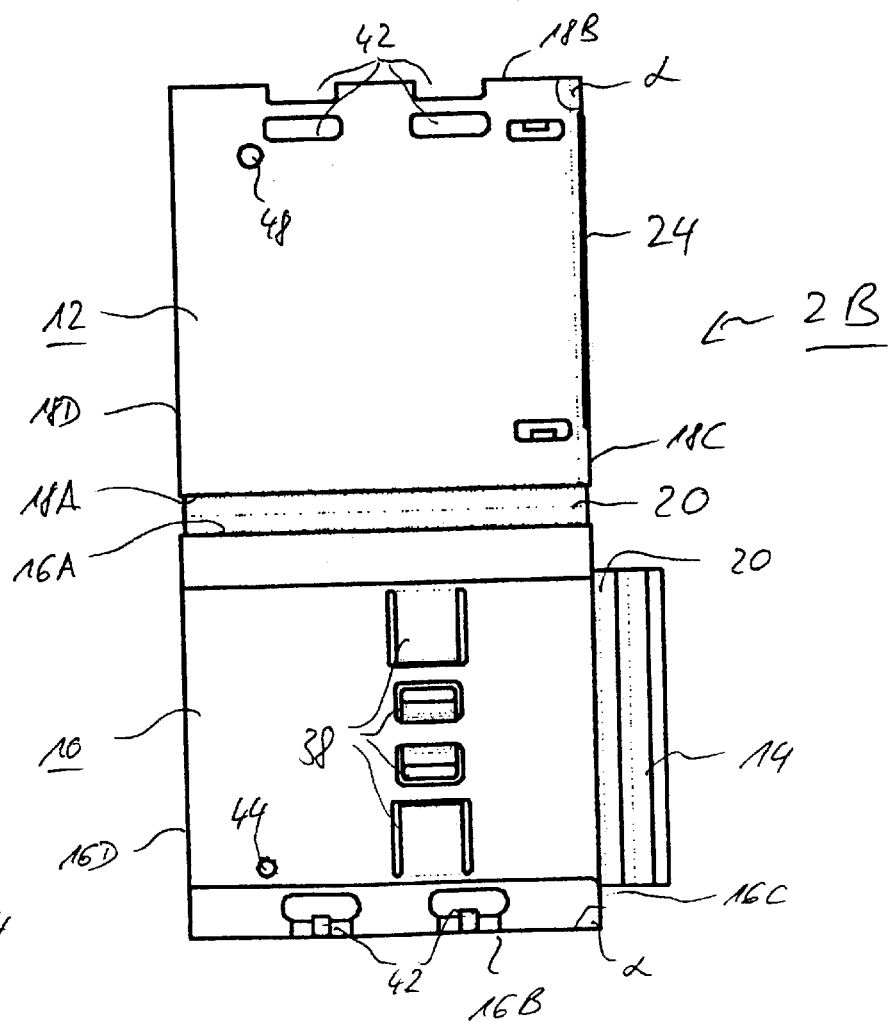
FIG. 4 shows the diverter device according to FIG. 3, in a folded-open initial position.

A second construction of a diverter device 2B for 180° transverse diversion or transverse folding of the film conductor 4 is shown in FIGS. 3 to 5. The diverter device 2B is thereby constructed in a manner similar to the diverter device 2A according to FIGS. 1 and 2. The essential difference is in the modified angular arrangement of base sides 16A,B or 18A,B to frontal sides 16C,D or 18C,D. Here, the angle α is now 90°, so that entry longitudinal direction 28 runs opposite to exit longitudinal direction 30. The diverter device 2B is therefore used for the 180° diversion of the film conductor 4.

On the basis of FIG. 5, it can be seen that two fastening elements 38 are provided on the lower assembly side 36. The one fastening element is fashioned for example as a latch element for a latch connection. The other is fashioned as protection against twisting, having a cross-shaped profile when seen in cross-section.

In addition, FIG. 5 illustrates in cross-section that the protective flap 14 is fashioned approximately in the shape of a lying J, i.e., in rounded fashion. The curvature of the protective flap 14 is thereby essentially adapted to the curvature of the rounded diverting edge 24.

Figure 6:
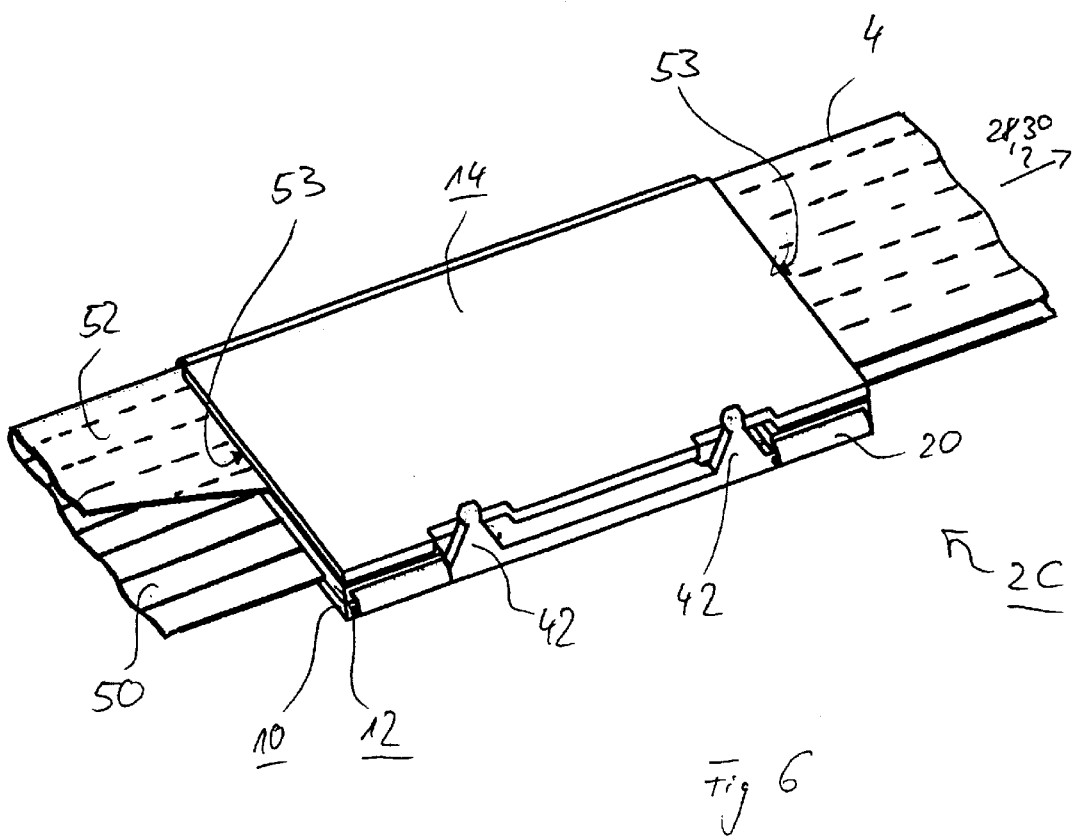
FIG. 6 is a perspective view of a diverter device for longitudinal folding of a film conductor, in the final assembled state, with installed film conductor.

A third alternative specific embodiment of a diverter device 2C for longitudinal diversion or longitudinal folding of the foil conductor 4 can be seen in FIG. 6. Here, the film conductor 4 is folded together in its longitudinal direction 28, so that it is guided in two layers. In this diverter device 2C, entry longitudinal direction 28 and exit longitudinal direction 30 accordingly coincide. In the final assembled state, as shown in FIG. 6, a lower partial path 50 of film conductor 4 is clamped between the base flap 10 and the diverter flap 12, and an upper partial path 52 of the film conductor 4 is clamped between the diverter flap 12 and the protective flap 14. In this construction, an additional guide region 53 is therefore formed between the diverter flap 12 and the protective flap 14. The film conductor 4 is therefore clamped in sandwich fashion with both its partial paths 50, 52 between flaps 10, 12, 14, which are arranged in layers. The process of putting the film conductor 4 into place in the diverter device 2C for the longitudinal folding is explained in connection with an additional specific embodiment shown in FIGS. 8 to 10.

A diverter device 2C of this sort for longitudinal folding is used in particular for connecting a film conductor 4 to a multi-row terminal plug, i.e., to a plug having a plurality of levels with possible plug connections. The longitudinal folding makes it possible to guide the lower partial path 50 into the lower level, and the upper partial path 52 of the film conductor 4 into the upper level, of the multi-row terminal plug. In order to make it possible to situate the two partial paths 50, 52 at a sufficient distance from one another for a simple assembly, the film conductor is provided with a longitudinal slot at least in its connection to the diverter device 2C, so that the two partial paths 50, 52 can be guided as paths separate from one another.

Figure 7:
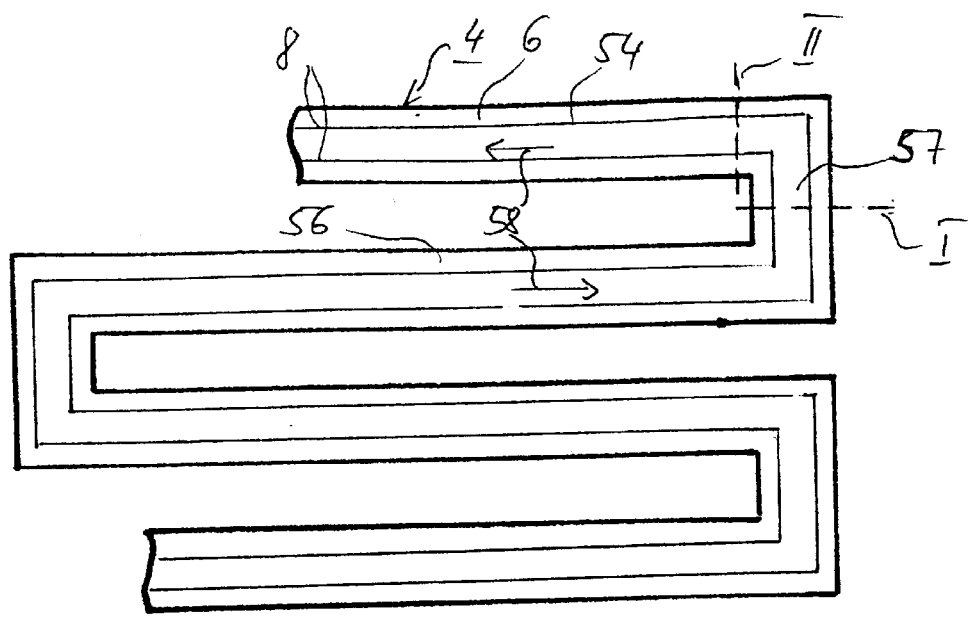
FIG. 7 shows a film conductor constructed with a meandering shape.
Figure 8:
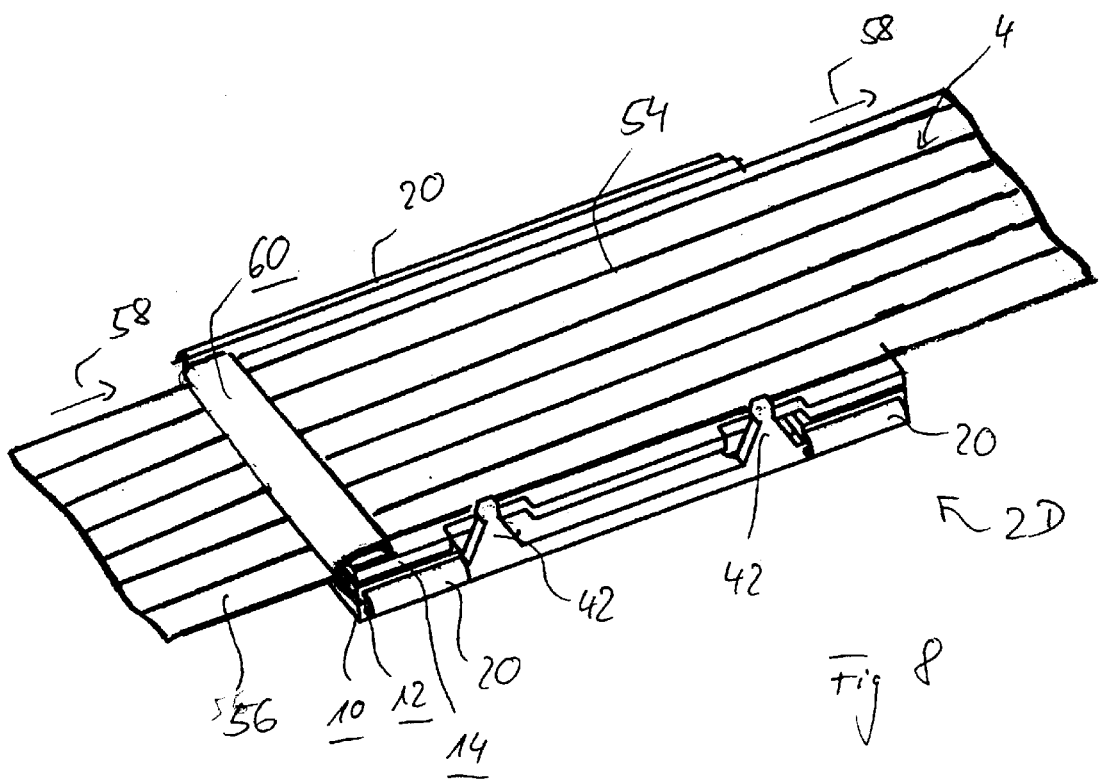
FIG. 8 is a perspective view of a diverter device for the simultaneous longitudinal folding and transverse folding of a film conductor, in a final assembled state with installed film conductor.
Figure 9:
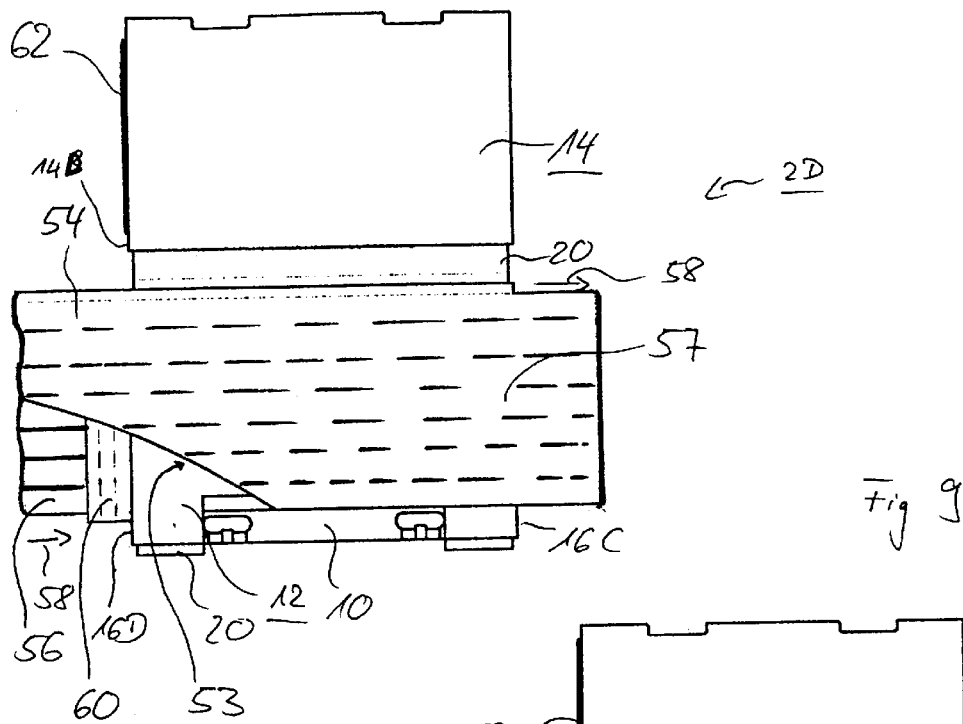
FIG. 9 shows the diverter device according to FIG. 8 in an intermediate assembly position.
Figure 10:
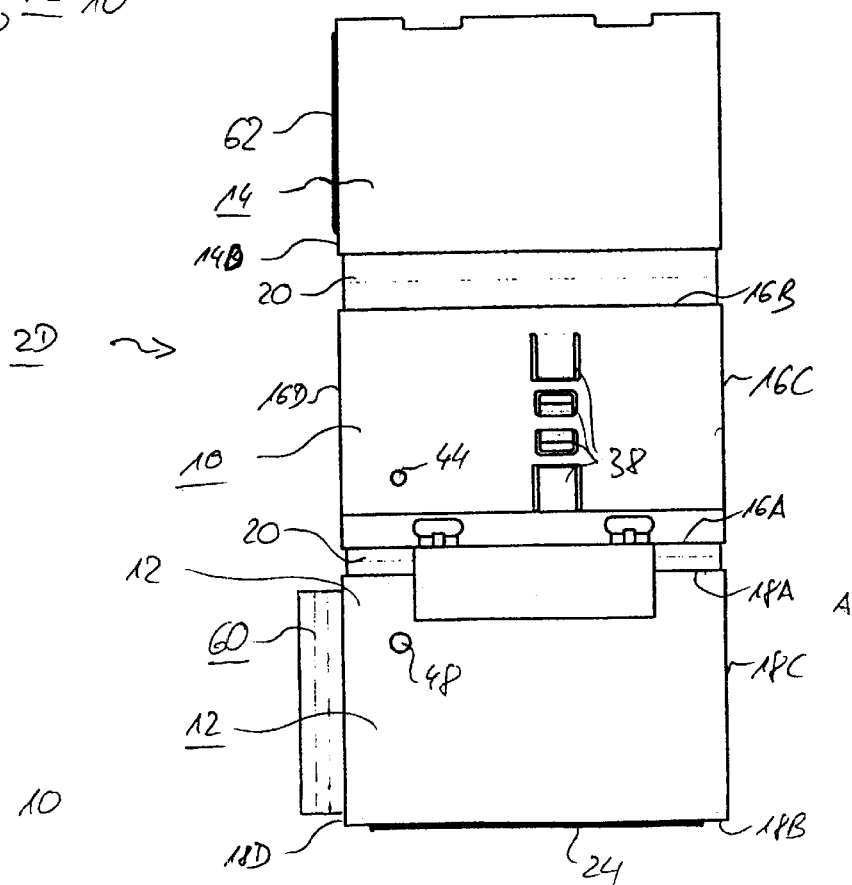
FIG. 10 shows the diverter device according to FIG. 8 in the folded-open state, without the film conductor.

An additional specific embodiment of a diverter device 2D according to FIGS. 8 to 10 is used for the simultaneous longitudinal and transverse diverting of film conductor 4. Diverter device 2D is used in particular for the folding or longitudinal extension of a film conductor 4 that runs in a meander fashion, as shown for example in FIG. 7. The meander-type construction of the film conductor 4 results from its manufacture. And for the manufacture of the film conductor, carrier layer 6 is deposited with printed conductors 8 on a board having limited dimensions. Due to the limited dimensions of the board, a quasi-continuous construction of film conductor 4 is not possible. It is therefore fashioned as a meander, in order to make optimal use of the space available on the plate. If a film conductor 4 that runs in a straight line, having a comparatively long length, is required, then the meander-shaped film conductor 4 is easily "unfolded," by means of diverter device 2D, so that a single elongated film conductor 4 is formed. This unfolding takes place on the one hand through a longitudinal folding along broken line I, as well as a transverse folding along broken line II. The longitudinal folding along line I ensures that a first meander partial path 54 comes to lie over a second meander partial path 56. In this state, the longitudinal directions 58 of the two meander partial paths 54, 56 are oriented opposite to one another. The transverse folding along line II provides a rectification [or: identical orientation] of longitudinal directions 58. The two meander partial paths 54, 56 are thereby connected with one another via an intermediate piece 57.

The unfolding process by means of diverter device 2 is explained in the following on the basis of FIGS. 8 to 10. FIG. 10 thereby shows that diverter device 2D comprises a total of four flaps, i.e., base flap 10, diverter flap 12, protective flap 14, and an additional protective flap 60. As is also the case in the specific embodiments for transverse diverting, base plate 10 and diverter flap 12 are connected with one another at their base sides 16A, 18A, which face one another via a film hinge 20. In contrast to the specific embodiments for transverse folding, protective flap 14 is arranged pivotably via a film hinge 20, for longitudinal folding on the second base side 16B of base flap 10. These three flaps 10, 12, 14 each have approximately the same base surface.

Diverter device 2C according to FIG. 6, fashioned purely for longitudinal folding, thereby corresponds to the arrangement of these three flaps 10, 12, 14, according to FIG. 10. The additional option of transverse folding is enabled in diverter device 2D according to FIG. 10 through the additional protective flap 60, and in particular through an additional diverting edge 62 on a frontal surface 14D of protective flap 14.

For the longitudinal folding, film conductor 4 is placed as on base flap 10. And second meander partial path 56 is introduced at the frontal side, so that intermediate piece 57 lies on base flap 10, and, if necessary, a small piece extends past second frontal side 16C. the width of base flap 10, and thus approximately the width of diverter device 2D, thereby corresponds approximately to the width of a meander partial path 54, 56, and, in the case of FIG. 6, to the width of the two partial paths 50, 52. The second partial path, i.e., upper partial path 52 according to FIG. 6, or first meander partial path 54 according to FIG. 9, thus overlaps base flap 10 over its base side 16B. in the second method step, diverter flap 12 is pivoted about base side 16A of base flap 10, and second meander partial path 56 is clamped, with a part of intermediate piece 57, between base flap 10 and diverter flap 12. Subsequently, the remaining part of intermediate piece 57 is bent around diverting edge 24, and lies on the upper side of diverter flap 12. This intermediate assembly position is shown in FIG. 9. In the next step, protective flap 14 is pivoted about film hinge 20, so that first meander partial path 54 is clamped, with intermediate piece 57, between protective flap 14 and diverter flap 12 in additional guide region 53. Individual flaps 10, 12, 14 are latched with one another in this position, so that film conductor 4 is firmly clamped in diverter device 2C, D, which can be seen in FIG. 6.

For transverse folding, first meander partial path 54 is now bent around additional diverting edge 62 on protective flap 14, and is clamped in this diverted position by means of additional protective flap 60. In order to simplify assembly, a holding element 34 can likewise again be provided as seen in FIGS. 1 and 2. Additional protective flap 60 is preferably likewise latched with protective flap 14.

In the final assembled state, as shown in FIG. 8, film conductor 4 is thus clamped in sandwich fashion by diverter device 2D in a total of three planes [or: layers]. The first plane is thereby situated between base flap 10 and diverter flap 12, the second plane is situated between diverter flap 12 and protective flap 14, and the third plane is situated between protective flap 14 and additional protective flap 60.

I claim:

1. A diverter device for a flexible circuit, comprising:
   a base flap;
   a diverter flap formed with a diverting edge and connected to said base flap, said diverter flap and said base flap each being formed with a surface extent having two base sides and frontal sides respectively disposed opposite one another, and said base flap and said diverter flap being connected with one another at one of said base sides thereof; and a protective flap connected to said base flap;

said base flap, said diverter flap, and said protective flap being pivotally connected for forming, in a final assembly state, when the flexible circuit is in place, a guide region between said base flap and said diverter flap about which the flexible circuit is guided, and which extends up to a diverting region for diverting the flexible circuit formed between said diverting edge and said protective flap.

2. The diverter device according to claim 1, wherein, in the final assembly state, said guide region and said diverting region are configured to clamp the flexible circuit.

3. The diverter device according to claim 1, wherein said diverting edge has a rounded cross-section.

4. The diverter device according to claim 1 configured for folding the flexible circuit transversely, wherein said diverting edge is provided on one of said frontal sides of said diverter flap, and an angle of diversion for the flexible circuit is defined by an angle enclosed between one of said base sides and said diverting edge.

5. The diverter device according to claim 4, wherein said protective flap is disposed on said frontal side of said base flap corresponding to said diverting edge.

6. The diverter device according to claim 1 configured for folding the flexible circuit longitudinally, whereby said diverting edge is disposed on said base side, facing away from said base flap, of said diverting flap.

7. The diverter device according to claim 6, wherein said protective flap is disposed on said base side off said base flap facing away from said diverter flap.

8. The diverter device according to claim 6, wherein said protective flap and said diverter flap are configured to form an additional guide region therebetween for the film conductor in the final assembly state.

9. The diverter device according to claim 6 configured for folding of the flexible circuit longitudinally and transversely, wherein an additional diverting edge formed for transverse folding.

10. The diverter device according to claim 9, wherein said additional diverting edge is formed on the frontal side on said protective flap.

11. The diverter device according to claim 9, which comprises an additional protective flap configured to cooperate with said additional diverting edge.

12. The diverter device according to claim 11, wherein said additional protective flap is connected with one of the frontal sides of said diverting flap.

13. The diverter device according to claim 1, which further comprises a fixing element in said guide region for fixing the flexible circuit.

14. The diverter device according to claim 1, wherein, in the final assembly state, at least some of said flaps are fixedly connected with one another.

15. The diverter device according to claim 1, wherein, in the final assembly state, at least some of said flaps are latched to one another.

16. The diverter device according to claim 1, which comprises a fastening element formed on an assembly lower side.

17. The diverter device according to claim 1 configured to receive a film conductor.

18. A diverter device for a flexible circuit, comprising:

a base flap;

a diverter flap formed with a diverting edge and connected to said base flap;

a protective flap connected to said base flap;

said base flap, said diverter flap, and said protective flap being pivotally connected for forming, in a final assembly state, when the flexible circuit is in place, a guide region between said base flap and said diverter flap about which the flexible circuit is guided, and which extends up to a diverting region for diverting the flexible circuit formed between said diverting edge and said protective flap; and a mounting element for holding a bent portion of the flexible circuit on an assembly upper side facing away from said guide region.

19. A diverter device for a flexible circuit, comprising:

a base flap;

a diverter flap formed with a diverting edge and connected to said base flap;

a protective flap connected to said base flap;

said base flap, said diverter flap, and said protective flap being pivotally connected for forming, in a final assembly states when the flexible circuit is in place, a guide region between said base flap and said diverter flap about which the flexible circuit is guided, and which extends up to a diverting region for diverting the flexible circuit formed between said diverting edge and said protective flap; and a coupling element formed on an assembly upper side for coupling to a further diverter device.

* * * * *